(12) United States Patent
Preiser et al.

(10) Patent No.: US 6,351,130 B1
(45) Date of Patent: Feb. 26, 2002

(54) DEVICE FOR TESTING SOLAR HOME SYSTEMS

(75) Inventors: Klaus Preiser, Ehrenkirchen; Jérôme Kuhmann, St. Peter, both of (DE)

(73) Assignee: Fraunhofer-Gesellschaft zur Foerderung der Angewandten Foschung E.V., Munich (DE)

( * ) Notice: Subject to any disclaimer, the term of this patent is extended or adjusted under 35 U.S.C. 154(b) by 0 days.

(21) Appl. No.: 09/720,592

(22) PCT Filed: Jun. 2, 1999

(86) PCT No.: PCT/DE99/01682

§ 371 Date: Dec. 22, 2000

§ 102(e) Date: Dec. 22, 2000

(87) PCT Pub. No.: WO00/00839

PCT Pub. Date: Jan. 6, 2000

(30) Foreign Application Priority Data

Jun. 26, 1998 (DE) ......................................... 198 28 560

(51) Int. Cl.⁷ ............................. H01M 10/44; H02J 7/16
(52) U.S. Cl. ....................................... 324/426; 320/101
(58) Field of Search ................................. 320/101, 106, 320/123; 307/66, 87; 323/205; 324/426

(56) References Cited

U.S. PATENT DOCUMENTS

| | | | | |
|---|---|---|---|---|
| 5,150,034 A | * | 9/1992 | Kyoukane et al. ............ 322/10 |
| 5,159,259 A | * | 10/1992 | Hart et al. ................... 320/123 |
| 5,235,266 A | * | 8/1993 | Schaffrin .................... 323/205 |
| 5,563,456 A | * | 10/1996 | Berger ......................... 307/66 |
| 5,608,306 A | * | 3/1997 | Rybeck et al. .............. 320/106 |
| 6,049,190 A | * | 4/2000 | Canter et al. ............... 320/101 |

\* cited by examiner

Primary Examiner—Peter S. Wong
Assistant Examiner—Pia Tibbits
(74) Attorney, Agent, or Firm—Jordan and Hamburg LLP (57) ABSTRACT

The invention relates to a device for testing solar home systems including at least one of each of the following components: a photovoltaic solar generator, a battery, a charge controller and a load. According to the invention, connecting means are provided. These enable the device to be connected to the at least one charge controller, the at least one charge controller having been uncoupled from the other components; to the at least one solar generator, to the at least one battery and to the at least one load. The device also includes testing means with which all the components can be tested individually and within their typical operational connections to each other in order to determine the parameters and states which are characteristic to the operativeness of the solar home system being tested. Display means for displaying the parameters and states that are tested are also provided. The inventive device enables less qualified employees to reliably test solar power installations with all the components which are interconnected on an interruptible bridge since the device is easy to connect to all the components in their entirety using the connecting means and since the test can be carried out automatically without manual intervention in connections of the solar power installation.

23 Claims, 7 Drawing Sheets

DEVICE FOR TESTING SOLAR HOME SYSTEMS

BACKGROUND OF THE INVENTION

The invention relates to a device for checking autonomous solar installations, which comprise in each case at least a photovoltaic solar generator, a battery, a charge controller and a load as the components.

Autonomous solar installations, such as so-called solar home systems, abbreviated to SHS, autonomously supply especially domestic areas having a relatively low power consumption with power independently of a main supply. They are usually assembled from a photovoltaic solar generator, a battery, a charge controller as well as a load composed of, for example, several consumers, which are interconnected with one another. In order to ensure that such solar installations function in an orderly manner, as is frequently required for the very existence of the owners, it is necessary to check the individual components on a regular basis, in order to be able to identify threatening functional failures of the whole solar installations in good time. Until now, this checking was carried out by disconnecting the individual components of the solar installations from one another and checking them at great expense with a battery-supplied voltage source, a voltmeter, an ohmmeter, a clip-on ammeter and an acid leakage meter. However, for checking in an orderly manner, qualified technical personnel is required, since it is necessary not only to carry out relatively complicated measuring procedures at the individual components but also, after the individual tests are carried out, to connect the solar installation once again into a functioning state. Moreover, after the individual components have been connected once again into a functioning state, it is not possible to check the solar installation. However, this is a not inconsiderable problem for the planning and maintenance of a decentralized power supply, especially in developing countries.

SUMMARY OF THE INVENTION

It is an object of the invention, to provide a device for checking autonomous solar installations, which comprise, as components, in each case at least a photovoltaic solar generator, a battery, a charge controller and a load, which permits such solar installations to be checked simply, quickly and, nevertheless reliably even by less qualified technical personnel.

This objective is accomplished for a device of the type named above with means for connecting to the charge controller, uncoupled from the remaining components, with means for connecting to the or each solar generator, the or each battery as well as the or each load with the charge controller or controllers uncoupled, with means for testing, with which the components can be checked individually and when connected with one another in typical operational fashion for determining characteristic parameters and conditions for the functioning capability of the solar installation, which is to be checked, and with display means for indicating the checked parameters and conditions.

The device can be connected with connecting means on the one hand to at least one uncoupled charge controller and, on the other, to the remaining components of a solar installation, which is to be checked, such as a direct current system, supplied photovoltaically independently of a main supply, and the components can be checked with testing means individually or when connected with one another in a typical operational fashion, a solar installation can be checked without expensive modifications with a device, constructed as a hand testing implement with test lead trees and test plugs automatically without manual intervention even by less qualified personnel.

Advantageously, the connecting means comprise connector strips, which can be inserted into assigned socket terminal strips of connecting rail for the components, which can be interrupted by a bridge.

For the maintenance-free operation of the inventive device, the testing means and the display means advantageously can be connected over voltage converters for supplying power externally to at least one battery of the solar installation, so that problems with an internal energy supply, such as the availability of batteries are avoided even in remote areas with a poor infrastructure.

For checking switching thresholds of the at least one charge controller very accurately, the testing means advantageously comprise an adjustable reference voltage source.

Various test modes can be carried out in refinements of the inventive device.

In one setting of the testing means and the display means, a self-test, with which the efficiency over workability of control means and switching means can be checked, can be carried out to check the proper functioning.

In a further setting of the testing means and the display means, a solar generator test can be carried out, for which the open circuit voltage and the short circuit current of at least one solar generator can be measured with at least one battery and at least one load component uncoupled from the at east one charge controller.

In a further setting of the testing means and the display means, a battery test of the at least one battery can be carried out, for which the open circuit voltage, the voltage when the at least one load is connected as well as when the at least one solar generator and the charging current with the at least one load uncoupled are connected, can be measured.

In the case of the solar generator test and the battery test, the testing means advisably comprise a reference solar generator for determining the incident radiation from the sun.

In a further setting of the testing means and the display means, a load test can be carried out, for which the voltage and the current of the at least one load as well as the voltage of the at least one battery can be measured with the at least one solar generator uncoupled.

In the developments for carrying out the tests, it is advantageous when providing the adjustable reference voltage source that, in one setting of the testing means and display means for carrying out a charge controller test with the at least one solar generator, at least one battery as well as at least one load uncoupled, the adjustable reference voltage source can be connected to the at least one charge controller and the intrinsic consumption as well as the switching thresholds of the at least one charge controller can be checked.

For the charge controller test, the testing means advantageously have a temperature sensor for determining the temperature of the surroundings.

BRIEF DESCRIPTION OF THE DRAWINGS

FIG. 2 shows a perspective view of the device of FIG. 1, FIGS. 3 and 4 show the functional construction of the arrangement of FIG. 1 in which, for the purpose of explanation, is illustrated by means of model circuit diagrams.

DETAILED DESCRIPTION OF THE INVENTION

Figure 1:
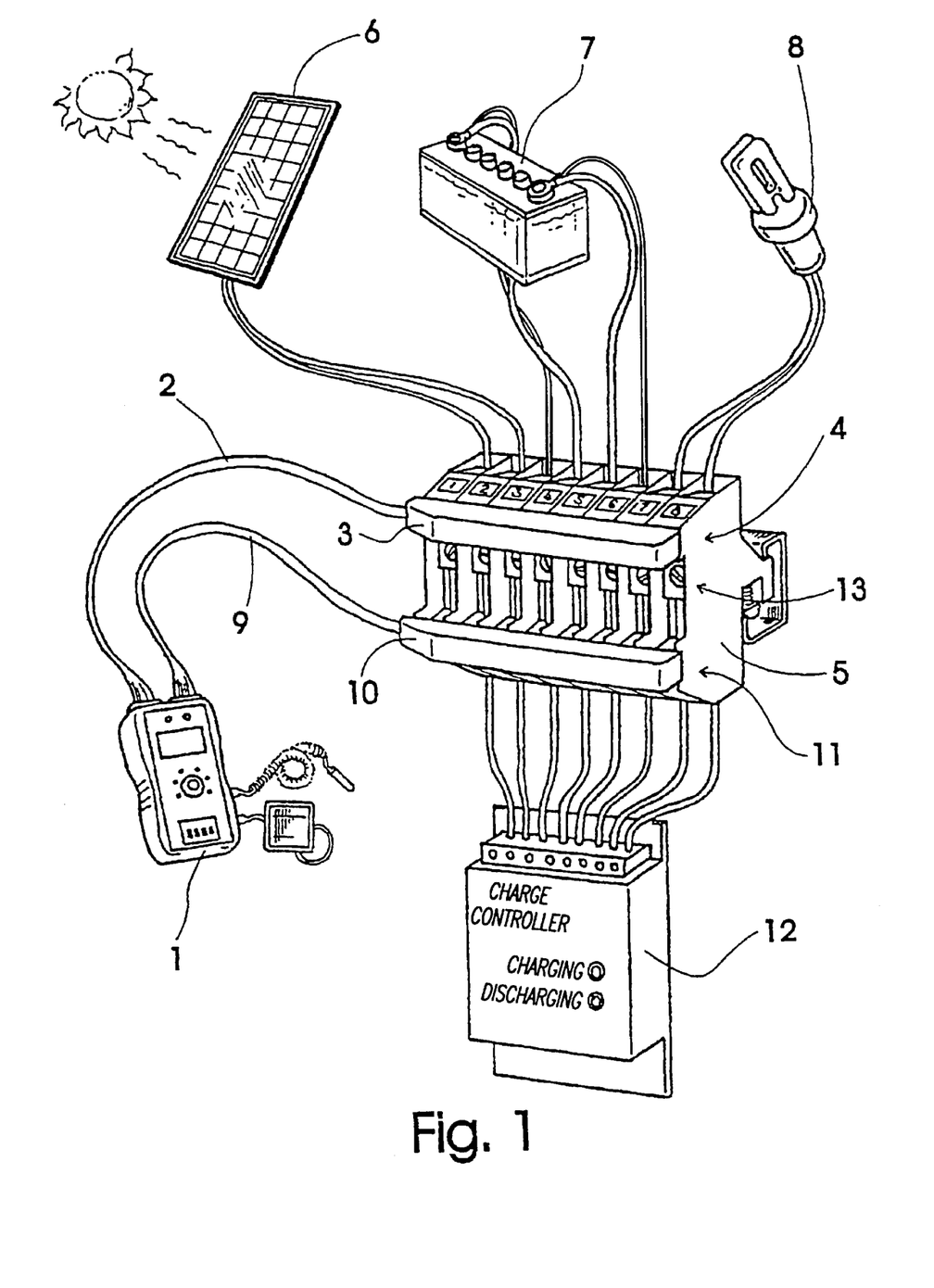
FIG. 1 in a clear perspective representation, shows a device, having a hand testing implement, for checking autonomous solar installations which, together with further components of the solar installation, are connected to a connecting rail.

FIG. 1, in a clear perspective representation, shows an example of an inventive device, comprising a hand testing implement 1 with testing means and display means for checking autonomous solar installations in the form of direct current systems, which are independent of a main power supply and are supplied by photovoltaic means. The device of FIG. 1 has a first test lead tree 2 and, connected to the first test lead tree, a first test plug 3 from connecting means which, when the first test plug 3 is inserted into a first socket terminal 4 of a connecting rail 5, is connected with a solar generator 6, a battery 7 as well as a load 8 as components of a solar installation, which is to be checked.

Furthermore, the device of FIG. 1 has a second test lead tree 9, as well as a second test plug 10 from connection means which, when the second test plug 10 is inserted into a second socket terminal strip 11 of the connecting rail 5, is connected with a charge controller 12 as a further component of the solar installation, which is to be checked. The connecting rail 5 furthermore is constructed with a bridge 13, which connects the solar generator 6, the battery 7 and the load 8 on the one hand with the charge controller 12 and, on the other. After removal of the bridge 13 from the connecting rail 5 and inserting the test plugs 3, 10 in the associated socket terminal strips 4, 11, the hand testing implement 1 is connected between the solar generator 6, the battery 7, the load 8 as well as the charge controller 12.

Figure 2:
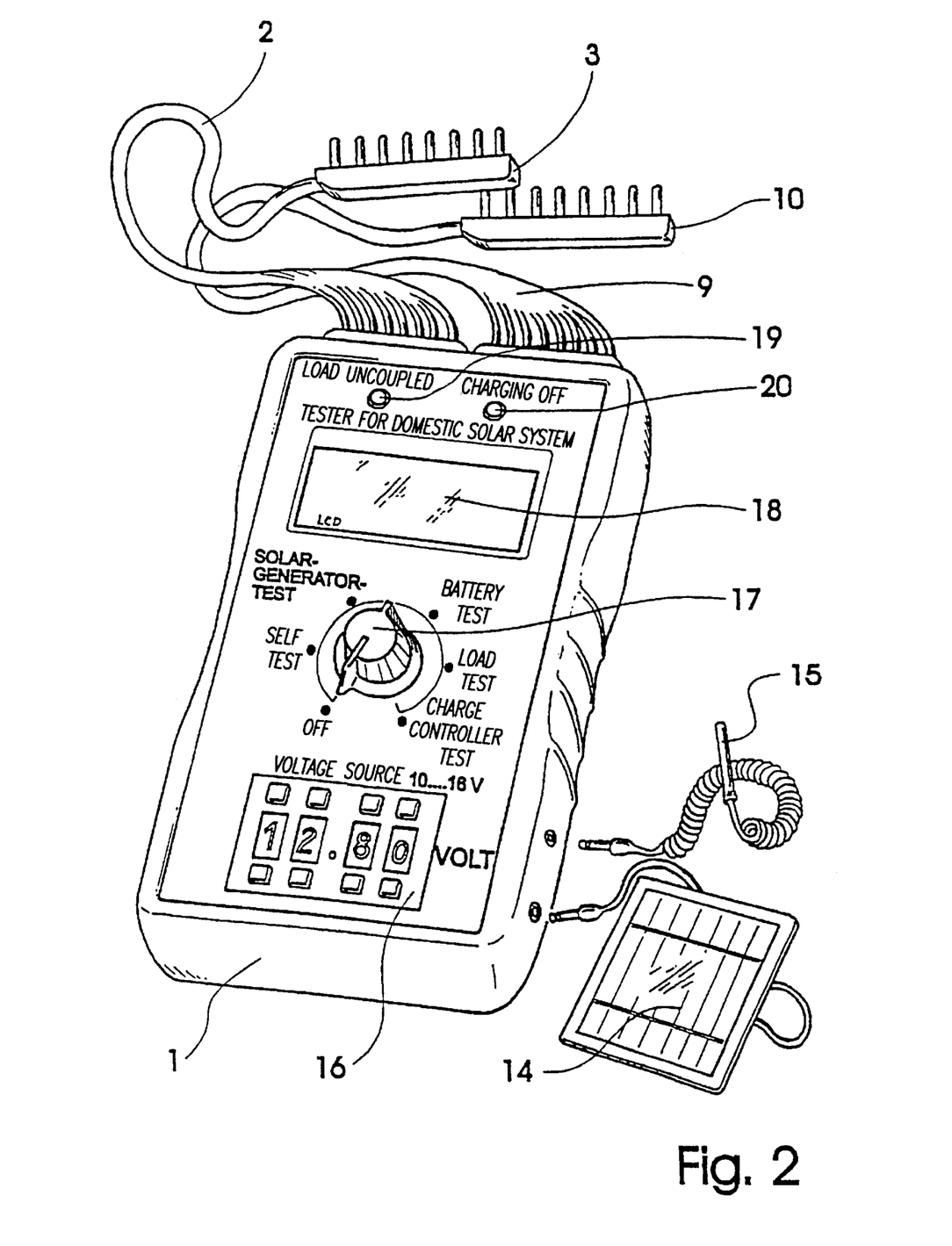

FIG. 2 shows a perspective representation particularly of the hand testing implement 1 of the device of FIG. 1, to which the test lead trees 2, 9 and test plugs 3, 10 are connected. A reference solar generator 14, as well as a temperature sensor 15 from the testing means of the inventive device, shown by way of example, can be connected to the hand testing implement 1. The hand testing implement 1 has a voltage input unit 16, with which a reference voltage can be set accurately to at least 100 millivolt and preferable to at lest 10 millivolt. The hand testing implement 1 furthermore is equipped with a test selection switch unit 17, which in the example shown is constructed as a multistep rotary switch and over which the solar generator 6, the battery 7, the load 8 and the charge controller 12 can be tested individually and in typical operational connections with one another for determining characteristic parameters and conditions typical of the functioning capability of the solar installation that is to be checked. Displays, integrated in the hand testing implement of the inventive device shown by way of example comprise a multi-line liquid crystal display 18, as well as a deep-discharging protection display 19 and an overload protection display 20.

Figure 3:
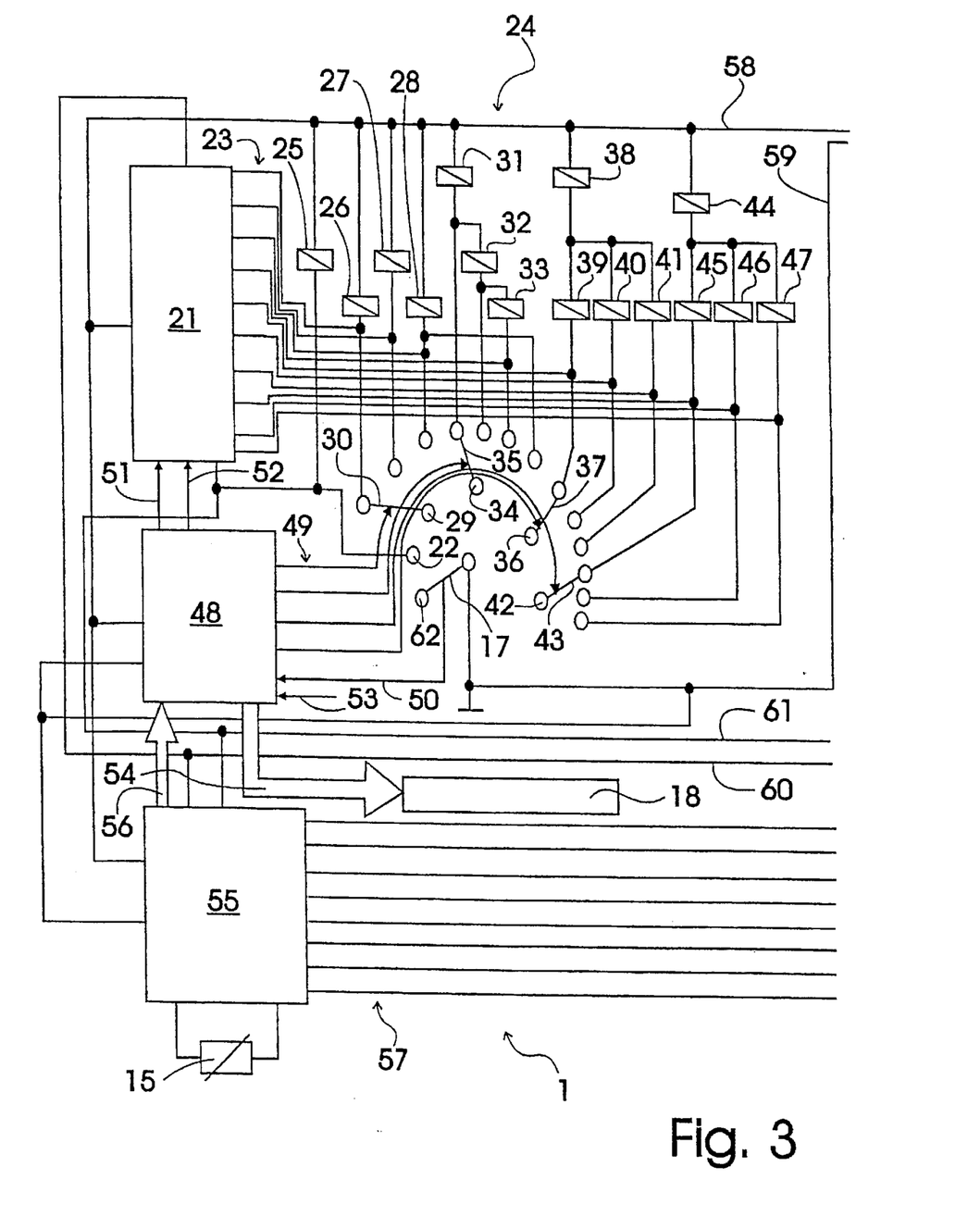
Figure 4:
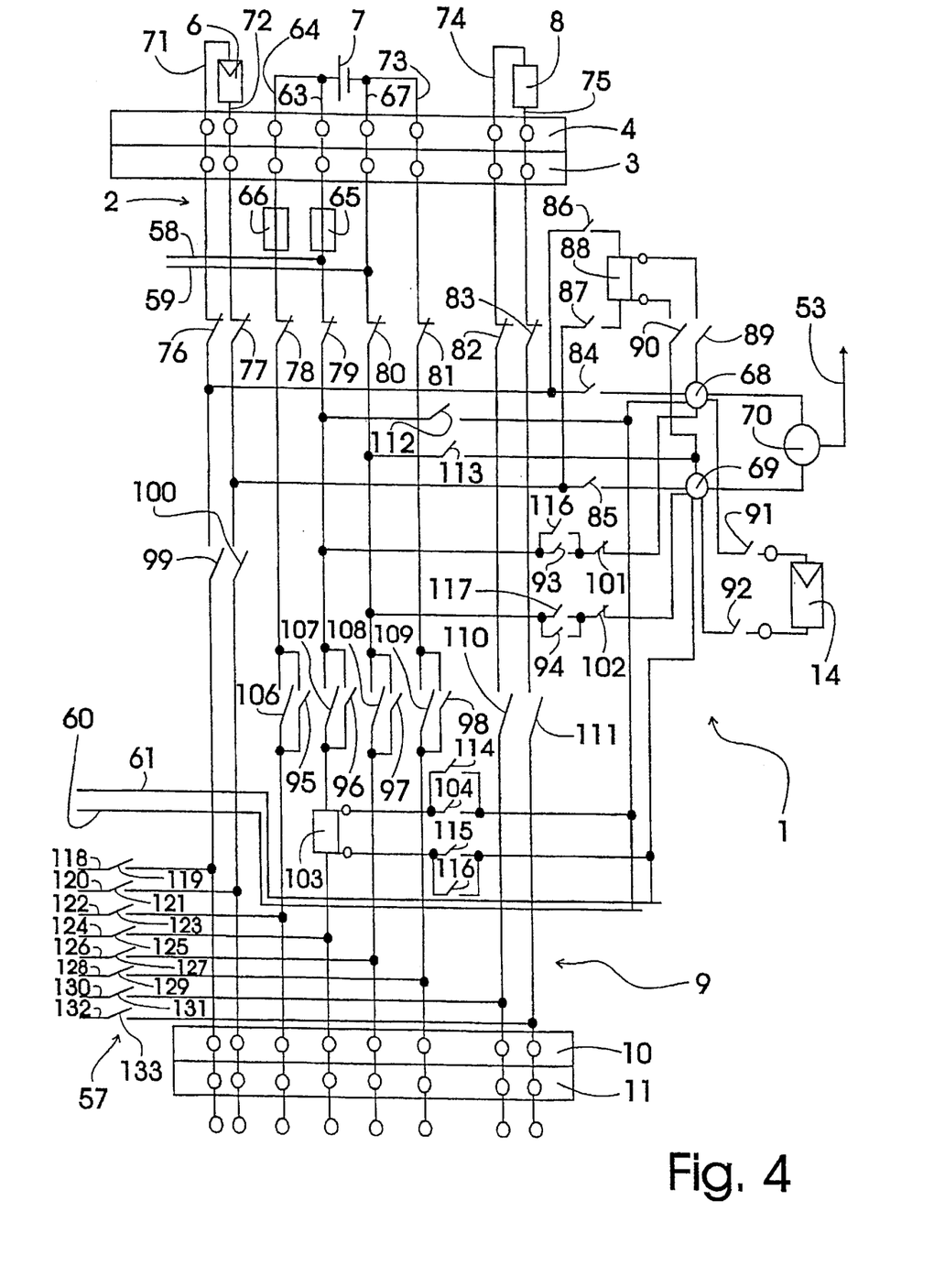

FIGS. 3 and 4 show the functional construction of the arrangement of FIG. 1 for the purpose of explanation by means of model circuit diagrams.

FIGS. 3 shows, in particular, controlling means of the inventive device, which is explained by way of example. According to FIG. 3, the device has a self-testing switching unit 21, which can be addressed in a self-testing setting 22 of the test selection switch unit 17. The self-testing unit 21 is connected over a number of self-testing control connections 23 with a number of control modules of a control arrangement 24 of the testing means. The control arrangement 24 comprises a self-testing control module 25, which can be addressed directly in the self-testing control setting 22 of the test selection switch unit 17. The control arrangement 24 furthermore has a first solar generator test control module 26, a second solar generator test control module 27 and a third solar generator test control module 28, which can be addressed in a solar generator test setting 29 of the test selection switch unit 17 over a solar generator test switch module 30.

The control arrangement 24 furthermore has a first battery test control module 31, a second battery test controlling module 32, as well as a third battery test control module 33 which, cascaded in a battery testing setting 34 of the test selection switch unit 17, can be controlled over a battery test switch module 35. The third solar generator test control module 28 can be addressed in a further setting of the battery test switch module 35.

In a load testing setting 36 of the test selection switch unit 17, a load test main control module 38 can be addressed in each setting of a load test switch module 37 and, in addition, a first load test control module 39, a second load test control module 40 and a third load test control module 41 of the control arrangement 24 can be addressed in each case in one position, so that the load test control modules 39, 40, 41 in each case can be activated individually together with the load test main control module 38. Correspondingly, a charge controller test main control module 44 can be addressed in a charge controller test setting 42 of the test selection switch unit 17 over a charge controller test switching module 43 and, in addition, a first charge controller test control module 45, a second charge controller test control module 46 and a third charge controller test control module 47, together with the charge controller test main control module 44, can be addressed at different settings of the charge controller test switch module 43.

Furthermore, according to FIG. 3, the exemplary device has a control unit 48, which is connected over individual test control connections 49 with the solar generator test switch module 30, the battery test switch module 35, the load test switch module 37 as well as the charge controller test switch module 43 for their control. The setting of the test selection switch unit 17 of the control unit 48 can be fed in the over a test selection status connections 50.

Furthermore, control signals for carrying out a self-test can be supplied with the control unit 48 to the self-testing unit 21 over a switch test control connections 51 and a control test connection 52. A voltage measurement value connection 53 supplies a measured voltage value to the control unit 48. Furthermore, the control unit 48 is connected over a display bus lead 54 with the liquid crystal display 18.

According to FIG. 3, the device furthermore has a charge controller test unit 55, to which the temperature sensor 15 is connected. The charge controller test unit 55 is connected over a charge controller test bus connection 58 with the control unit 48. Furthermore, the charge controller test unit 55 is connected with a number of charge controller test connections 57.

The controlling modules 25 to 28, 31 to 33, 38 to 41, 44 to 47, as well as the self-testing unit 21, the control unit 48 as well as the charge controller test unit 55 are connected to the positive terminal of the battery. The control unit 48 as well as the charge controller test unit 55 are connected to the negative terminal 59 of the battery, so that these, together with the liquid crystal display 18, can be supplied externally with electric energy. Furthermore, the test selection switch unit 17 is connected to the negative terminal 59 of the battery and, in the settings 22, 29, 34, 36, 42 of the test selection switch unit 17, the self-testing unit 21 or the control modules 25 to 28, 31 to 33, 38 to 41, 44 to 47 can be connected over the corresponding switch modules 30, 35, 37, 43 to the negative terminal 59 of the battery for the appropriate activation. A positive voltage measurement tap 60 as well as a negative voltage measurement tap 61 are connected to the self-testing unit 21 as well as to the charge controller testing unit 55.

Finally, the hand testing implement 1 can be deactivated in a switching-off positions 62 of the test selection switch unit 17 of FIG. 3.

FIG. 4 shows, in particular, switching means of the device, explained by way of example in the arrangement of FIG. 1. A positive battery load lead 63 and a positive battery test lead 64 are each provided with fuses 65, 66. The positive battery connection 58 is connected to the positive battery load lead 63 and the negative battery connections 59 is connected to a negative battery load lead 67. The positive voltage measuring tap 60 is connected to a positive tap 60 a and the negative voltage measuring tap 61 is connected to a negative tap 69. Furthermore, a dc voltage meter 70 is connected with the positive tap 68 and the negative tap 69 and, over the voltage measurement value connection 53 with the control unit 48.

The solar generator six is connected with a positive solar generator lead 71 and a negative solar generator lead 72 to the first socket terminal strip 4. The battery 7 is contacted with the positive battery load lead 63, the positive battery test lead sixty-four, the negative battery load lead 67 and a negative battery test lead 73 with the first socket terminal strip 4. Finally, the load 8 is connected with a positive load lead 74 and a negative load lead 75 to the first socket terminal strip 4, into which, in the representation of FIG. 4, the first test plug 3 is inserted.

For carrying out a self-test in the self-testing setting 22 of the test selection switch unit 17, the example of an inventive device described has a first self-testing switch 76, placed in the positive solar generator lead 71, a second self-testing switch 77, placed in the negative solar generator lead 72, a third self-testing switch 78, placed in the positive battery testing lead 64, a fourth self-testing switch 79, placed in the positive battery load lead 73, a fifth self-testing switch 80, placed in the negative battery load lead 67, a sixth self-testing switch 81, placed in the negative battery test lead 73, a seventh self-testing switch 82, placed in the positive load lead 74 and an eighth self-testing switch 83, placed in the negative load lead 75. The self-testing switches 76 to 83, which are constructed as break contacts, can be opened in the self-testing position 22 of the test selection switch unit 17 when the self-testing control module 25 is triggered, so that the solar generator 6, the battery 7 as well as the load 8 are uncoupled from the hand testing implement 1.

For carrying out a solar generator test in the solar generator test position 29 of the test selection switch unit 17, a first solar generator test switch 84 is placed between the positive solar generator lead 71 and the positive tap 68 and a second solar generator test switch 85, which can be closed over the first solar generator test control module 26, is placed between the negative solar generator lead 72 and the negative tap 69. Furthermore, a third solar generator test switch 86 is connected to the positive solar generator lead 71 and a fourth solar generator test switch 87, which can be closed with the second solar generator test control module 27, is connected to the negative solar generator lead 72. The third solar generator test switch 86 and the fourth solar generator test switch 87 are connected with their further connections to a first solar generator measurement bridge 88, which in turn is connected over a fifth solar generator test switch 89 to the positive tap 68 and, over a sixth solar generator test switch 90, to the negative tap 69, which can be closed, in each case, by the second solar generator test control module 27. Furthermore, a seventh solar generator test switch 91 and an eighth solar generator test switch 90, connected to the positive tap 68, are provided and can be closed over the third solar generator test control module 28 with connection of the reference solar generator 14 with the positive tap 68 or the negative tap 69.

For carrying out a battery test in the battery test setting 34 of the test selection switch unit 17, a first battery test switch 93 is placed between the positive battery load lead 63 and the positive tap 68 and a second battery test switch 94 is placed between the negative battery load lead 67 and the negative tap 69. The first battery test switch 93 and the second battery test switch 94 can be closed over the first battery test control module 31, if the battery test switch module 35 is set appropriately. Furthermore, a third battery test switch 95 is placed in the positive battery test lead 64, a fourth battery test switch 96 is placed in the positive battery load lead 63, a fifth battery test switch 97 is placed in the negative battery load lead 67 and a sixth battery test switch 98, which can be closed over the second battery test control module 32, is placed in the negative battery test lead 73. A seventh battery test switch 99 is placed in the positive solar generator lead 71 and an eighth battery test switch 100, which also can be closed by the second battery test control module 32, is placed in the negative solar generator lead 72.

A ninth and battery test switch 101 is placed between the first battery test switch 93 and the positive tap 68 and a tenth battery test switch 102, which is constructed as a break contact and can be actuated over the third battery test control module 33, is placed between the second battery test switch 94 and the negative tap 69. In the positive battery load lead 63, a battery measuring bridge 103 is placed, to the taps of which an eleventh battery test switch 104 and a twelfth battery test switch 105 are connected. The eleventh battery test switch 104 and the twelfth battery test switch 105 can be actuated with the third battery control module 33. The eleventh battery test switch 104, with its further connection, contacts the positive tap 68 and the twelfth battery test switch 105 correspondingly contacts the negative tap 69.

In each case a first load test main switch 106, a second load test main switch 107, a third load test main switch 108 and a fourth load test main switch 109, which can be activated with the load test main control module 38 for carrying out a load test in the load test setting 36 of the test selection switch unit 17 in the appropriate setting of the load test switch module 37, are connected parallel to the third battery test switch 95, the fourth battery test switch 96, the fifth battery test switch 97 and the sixth battery test switch 98. Furthermore, a fifth load test main switch 110 is placed in the positive load lead 74 and a sixth load test main switch 111 is placed in the negative load lead 75 and can also be closed by the load test main control module 38.

A first load test switch 112 is placed between the negative battery load lead 67 and the positive tap 68 and a second load test switch 113 is placed between the negative battery test lead 73 and the negative tap 69. The first load test switch 112 and the second load test switch 113 can be connected at the appropriate setting of the load test switch module 37 with the first load test control module 39. A third load test switch 114 and a fourth load test switch 115 are placed parallel to the eleventh battery test switch 104 and the twelfth battery test switch 105 and can be connected at the appropriate setting of the load test switch module 37 with the second load test control module 40. Finally, a fifth load test switch 116 and a sixth load test switch 117 are placed parallel to the first battery test switched 93 and the second battery test switch 94 and can be connected at the appropriate setting of the load test switch module 37 with the third load test control module 41.

For carrying out a charge controller test in the charge controller test setting 42 of the test selection switch unit 17, the charge controller test connections 57 have a charge controller test connection 118, which is connected over a first charge controller test main switch 119 with the connection of the positive solar generator lead 71 at the charge controller 12. Correspondingly, a second charge controller test connection 120 and a second charge controller main switch 121 are connected to the connection of the negative solar generator lead 72 at the charge controller 12, a third charge controller test connection 122 and a third charge controller test main switch 123 are connected to the connection of the positive battery test lead 64 at the charge controller 12, a fourth charge controller test connection 124 and a fourth charge controller test main switch 125 are connected to the connection of the positive battery load lead 63 at the charge controller 12, a fifth charge controller test connection 126 and a fifth charge controller test main switch 127 are connected to the connection of the negative battery load lead 67 at the charge controller 12, a sixth charge controller test connection 128 and a sixth charge controller test main switch 129 are connected to the connection of the negative battery test lead 73 at the charge controller 12, a seventh charge controller test connection 130 and a seventh charge controller test main switch 131 are connected to the connection of the positive load lead 74 at the charge controller 12 and an eighth charge controller test connection 132 and an eighth charge controller test main switch 133 are connected to the connection of the negative load lead 75 at the charge controller 12. In the charge controller test position 42 of the test selection switch unit 17 as well as the corresponding settings of the charge controller test switch module 43, the charge controller test main switches 119, 121, 123, 125, 127, 129, 131, 133 can be connected with the charge controller test main control module 44.

Figure 5:
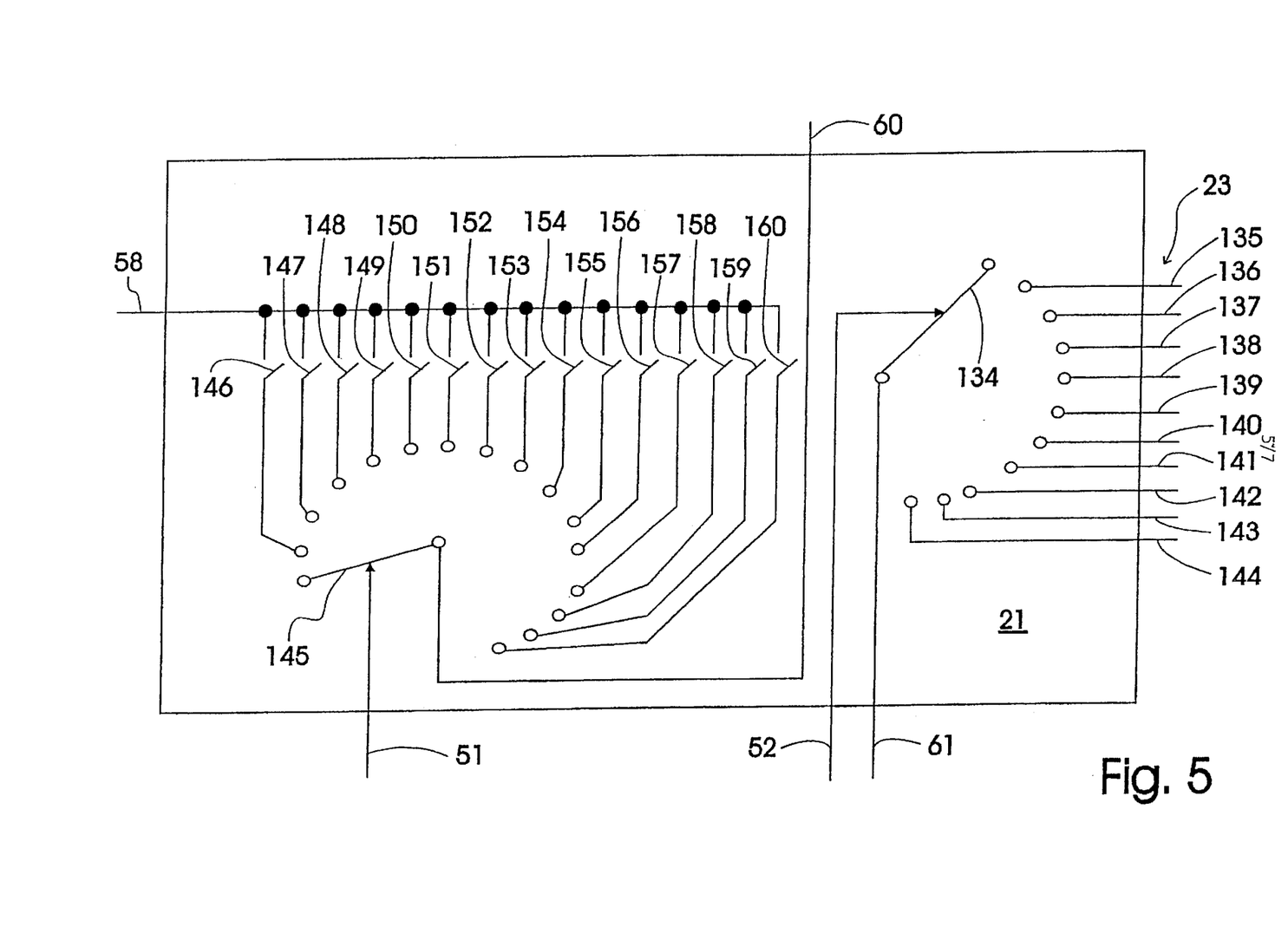
FIG. 5 shows a functional circuit diagram of a self-testing unit of the hand testing implement of FIGS. 3 and 4.

FIG. 5 shows a functional second diagram of the self-testing unit 21 of the hand testing implement 1 of FIGS. 3 and 4. The self-testing unit 21 has a control test switch module 134, which can be actuated over the control self-testing connection 52. The self-testing control connections 23 are connected to the outputs of the control test switch module 134. The first solar generator test control module 26 for testing the proper mode of functioning can be treated with a first self-testing control connection 135. For the purpose of testing the function, the second solar generator test control module can be actuated with a second self-testing control connection 136 and the third solar generator test control module 28 can be actuated with a third self-testing control connection 137. With a fourth self-testing control connection 138, the third battery test control module 33 as well as the cascaded further battery test control modules 31, 32 can be tested for proper functioning. With a fifth self-testing control connection 139, with a six self-testing control connection 140 and with a seventh self-testing control connection 141, the first load test control module 39, the second load test control module 40 and the third load test control module 41 can be checked together with the load test main control module 38. With an eighth control test connection 142, a ninth self-testing control connection 143 and a tenth self-testing control connection 144, the first charge controller control module 45, the second charge controller control test module 46 and the third charge controller control module 47 can be checked together with the charge controller main control module 44.

The functioning test of the self-testing control module 25 takes place automatically in the self-testing setting 22 of the test selection switch unit 17 by starting the self-test itself. The functional testing of the first battery test control module 31 and of the second battery test control module 32, which are cascaded with the third battery test control module 33, takes place by testing the function of the third battery test control module 33. Correspondingly, the functional testing of the first load test main control module 38, with which the load test control modules 39, 40, 41 are connected in series, and the functional testing of the charge controller test main control module 44, which is connected in series with the charge controller test control modules 45, 46, 47, take place over the functional testing of the load test control modules 39, 40, 41 and the charge controller test control modules 45, 46, 47, which have been connected in series.

Furthermore, the self-testing unit 21 of FIG. 5 has a switch test switch module 145, which is connected to the switch test control connection 51. A ninth solar generator test switch 146 is connect to the outputs of the switch test switch module 145, as well as at the positive battery connection 58 and can be closed over the first self-test control connection 135 with the first solar generator test control module 26. Correspondingly, a tenth solar generator test switch 147, which can be connected with the second solar generator test control module 27 that can be actuated over the second self-testing control connection 136, can be closed with the second solar generator test control module 27, which actuated over the second self-testing control connection 136, can be activated over the switch test switch module 145. Finally, an eleventh solar generator test switch 148 is provided, which can be closed over the third self-testing control connection 137 by means of the third solar generator test control module 28.

A thirteenth battery test switch 149, a fourteenth battery test switch 150 and a fifteenth battery test switch 151, which can be connected over the fourth self-testing control connection 138 with the cascaded battery test control modules 31, 32, 33 when triggering the third battery test control module 33, can be activated at the appropriate setting of the control test module 134 consecutively over appropriate settings of the switch test switch module 145. A seventh load test main switch 152 as well as a seventh load test switch 153, an eighth load test switch 154 as well as a ninth load test switch 155 can be closed over the load test main control module 38 and the load test control modules 39, 40, 41, which can be actuated over the fifth self-testing control connection 139, the sixth self-testing control connection 140 and the seventh self-testing control connection 141.

Correspondingly, a ninth charge controller test main switch 156 and a first charge controller test switch 157, a second charge controller test switch 158 and a third charge controller test switch 159, which can be actuated by the eighth self-testing control connection 142, the ninth self-testing control connection 143 and the tenth self-testing control connection 144 over the charge controller test main control module 44 and the charge controller test control modules 45, 46, 47, can be connected over the switch test switch module 145 with the positive voltage measuring tap 60.

Finally, a ninth self-testing switch 160 is provided, which can be closed over the self-testing switch module 25 in the self-testing setting 22 of the test selection switch unit 17.

For carrying out the self-test, the control test switch module 134 and the switch test switch module 145 can be triggered by the control unit 48 so that, when the switch modules 26 to 28, 31 to 33, 38 to 41, 44 to 47, connected to the self-testing control connections 23, 135 to 144, are acted upon, the self-testing module 25, triggered in the self-testing position 22 of the test selection switching unit 17, can be activated and the proper mode of functioning of the test switches 146 to 160, which can be interrogated over the switch test switch module 145, can be tested for proper functioning by checking the display of the dc voltage meter 70. By these means, it is ensured that the associated switch modules 25 to 28, 31 to 33, 38 to 41, 44 to 47 function properly.

Figure 6:
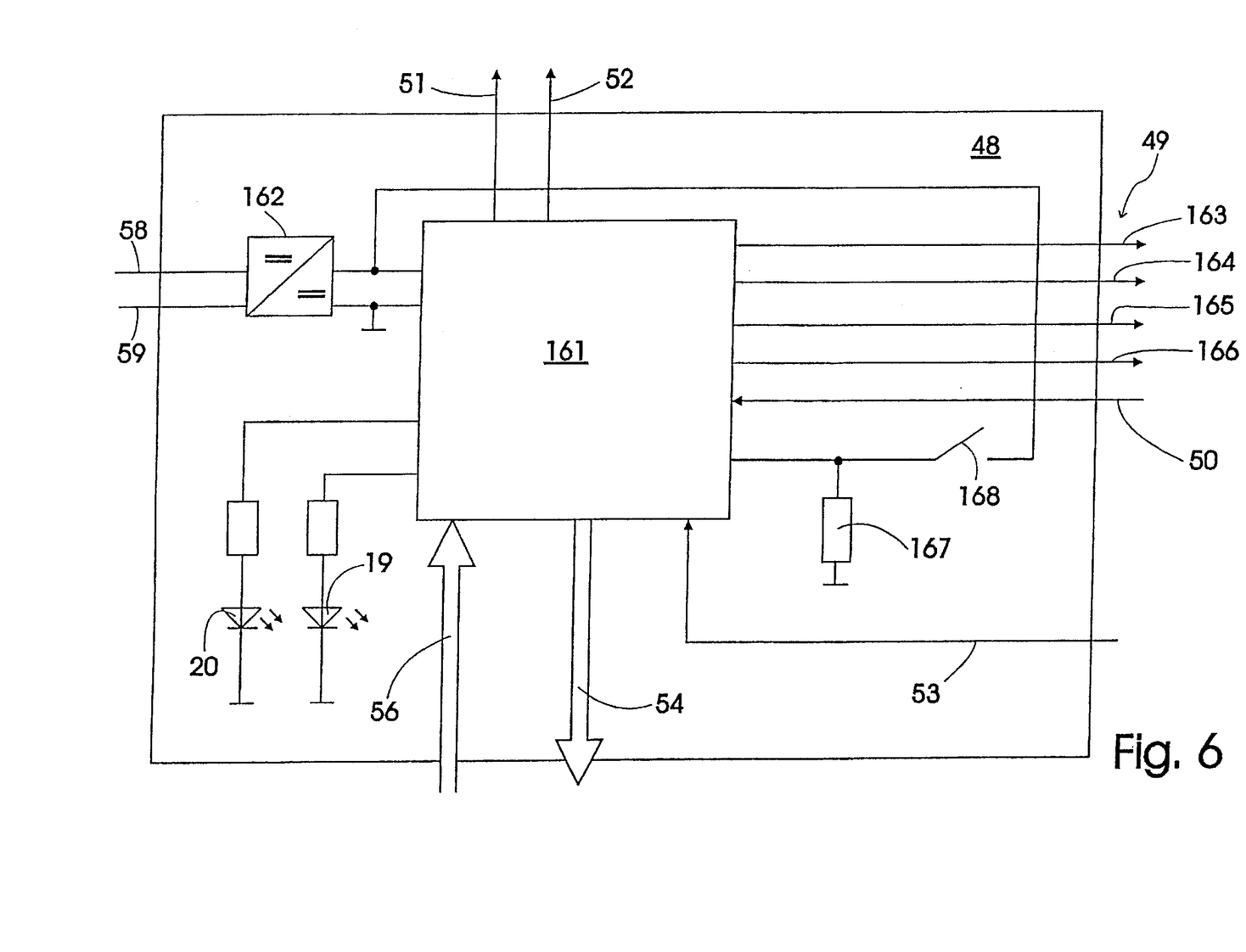
FIG. 6 shows a functional circuit diagram of the construction of a control unit of the hand testing implement of FIGS. 3 and 4 and FIG. 7 shows a functional circuit diagram of the construction of a charge controller testing unit of the hand testing implement of FIGS. 3 and 4.

FIG. 6 shows the construction of the control unit 48 of the hand testing implement 1 of FIGS. 3 and 4 in a functional circuit diagram. The control unit 48, for example, has a central module 161, which is constructed, for example, as a so-called microcontroller and is connected over a dc voltage converter 162 to the positive battery connection 58 and the negative battery connection 59 to the external power supply with an essentially constant dc voltage even when the voltage of the battery 7 fluctuates. Furthermore, the control test switch module 134 or the switch test switch module 145 of the self-testing unit 21 can be triggered with the central module 161 over the switch test control connection 51 or the self-testing control connection 52. Furthermore, the individual test control connections 49 can be activated with the central module 161, it being possible to actuate the solar generator test switch module 29 over a solar generator single test control connection 163 in the solar generator test setting 30 of the test selection unit 17. Correspondingly, over a battery single test control connection 164, a load single test control connection 165 or a charge controller single test control connection 166 in the battery test setting 34, the load test setting 36 or the charge controller test setting 42 of the test selection switch unit 17, the battery test switch module 35, the load test switch module 37 and the charge controller test switch module 43 can be activated in the appropriate settings.

The actual setting of the test selection switch unit 17 can be supplied over the test selection status connection 50 to the central module 161. Furthermore, over the voltage measurement value connection 53, the central module 161 can be acted upon with the dc voltage values measured by the dc voltage meter 70 at the taps 68, 69. The central module 161 is connected over the display bus lead 54 with the liquid crystal display 18 for indicating, for example, parameters and operating states of the hand testing implement 1. Data, taken up or produced by the charge controller test unit 55, can be supplied over the charge controller test bus connection 56 to the central module 161. Furthermore, the deep-discharging protection display 19 and the overload protection display 20, which are constructed, for example, as light-emitting diodes, are connected to the central module 161. Within the scope of the self-test, a tenth self-testing switch 168, which is connected to the positive output voltage of the dc voltage converter 162 and, over a protective resistance 167, with the central module 161 and which can be actuated over the self-testing control module 25, checks the functioning of the central module 161.

Figure 7:
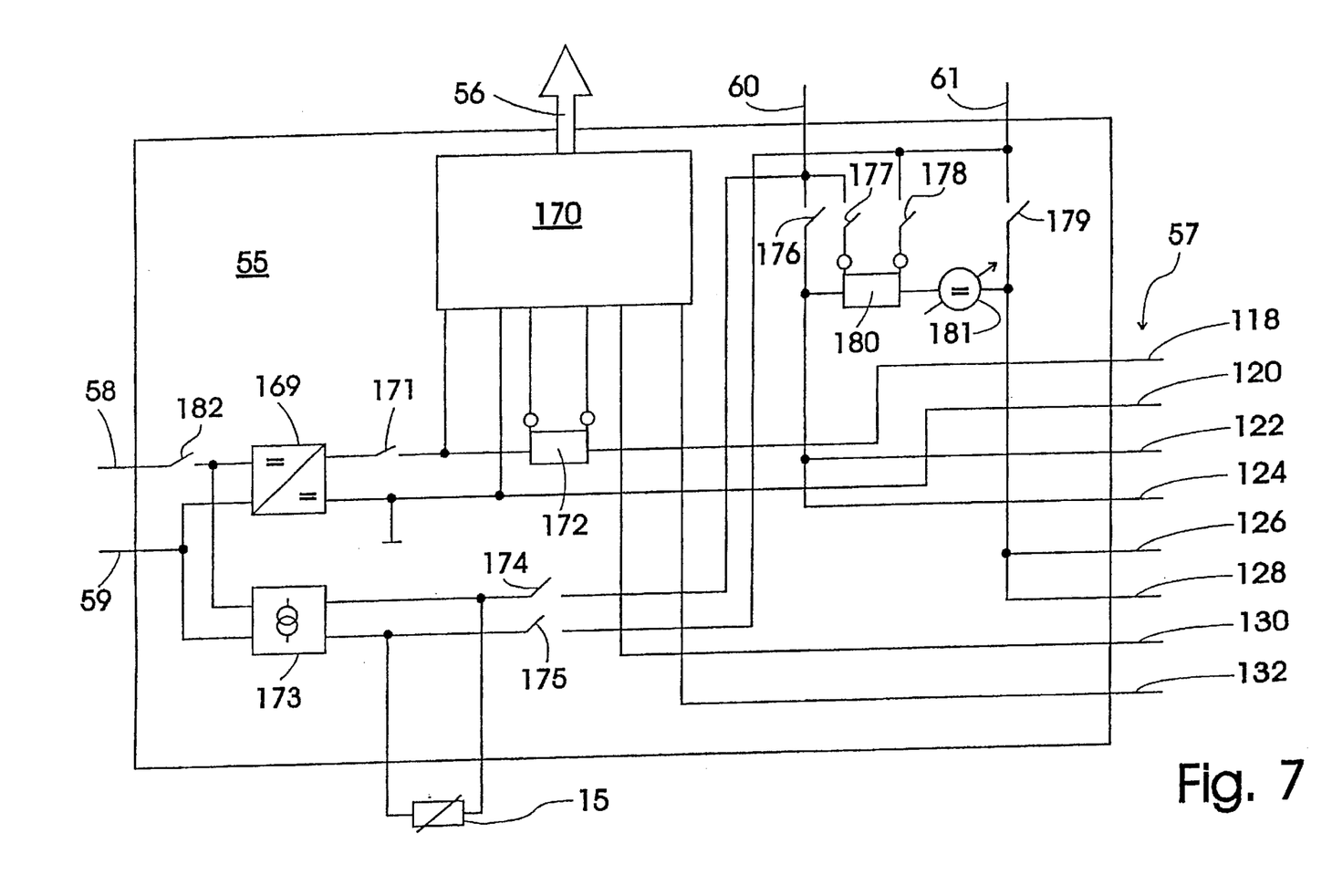

FIG. 7 shows the construction of the charge controller test unit 55 of the hand testing implement 1 of FIG. 3 in a functional circuit diagram. The charge controller test unit 55 is connected to the battery connections 58, 59 with a dc voltage converter 169 for externally supplying electrical energy of a constant dc voltage even when the voltage of battery 7 fluctuates. The outputs of the dc voltage converter 169 of the charge controller test unit 55 are supplied to a protective logic module 170, a fourth charge controller test switch 171 being placed between the positive output of the dc voltage converter 169 and an input of the protective logic module 170. Furthermore, a first charge controller measuring bridge 172, which is connected in series with the fourth charge controller test switch 171 and the outputs of which are connected with the protective logic module 170, is placed at the positive output of the dc voltage converter 169 of the charge controller test unit 55.

Furthermore, the seventh charge controller test connection 130 and the eighth charge controller test connection 132, which are contacted with the connection of the positive load lead 74 or the negative load lead 75 at the charge controller 12, are connected to the protective logic module 170. The first charge controller test connection 118 and the second charge controller test connection 120, which are connected with the respective connections of the positive solar generator lead 71 and the negative solar generator lead 72 to the charge controller 12, are also connected with the inputs of the protective logic module 170 contacting the dc voltage converter 169 of the charge controller test unit 55.

Furthermore, a source of constant current 173 of the charge controller unit 55 is applied to the battery connections 58, 59 and, on the one hand, supplies the temperature sensor 15 permanently with electric energy. A fourth charge controller test switch 174 and a fifth charge controller test switch 175, which can be connected with the first charge controller test control module 45 in an output lead of the constant current source 173 are connected in series with the connections of the temperature sensor 15 at the constant current source 173. The further output of the fourth charge controller test switch 174 is connected with the positive voltage measurement tap 60, to which furthermore a sixth charge controller test switch 176 and a seventh charge controller test switch 177 are connected. The further connection of the fifth charge controller test switch 175 is placed at the negative voltage measurement tap 61, at which furthermore an eighth charge controller test switch 178 and a ninth charge controller test switch 179 are contacted. The seventh charge controller test switch 177 and the eighth charge controller test switch 178 can be activated over the second charge controller test control module 46, while the sixth charge controller test switch 176 and the ninth charge controller test switch 179 can be closed over the third charge controller test control module 47.

Between the further connections of the seventh charge controller test switch 177 and the eighth charge controller test switch 178, the outputs of a second charge controller test measurement bridge 180 are placed, which at the input side are connected, on the one hand, with the fourth charge controller test connection 124, which is connected with the sixth charge controller test switch 176 and, on the other, over a reference voltage source 181, adjustable by means of the voltage input unit 16 over the operating voltage range of the battery 7 of, for example, about 10 volts to about 16 volts with the further connection of the ninth charge controller test switch 179, which is connected to the fifth charge controller test connection 126 as well as to the sixth charge controller test connection 128. Between the positive battery connection 58 as well as the dc voltage converter 169 of the charge controller test unit 55 and the source 173 of constant current, a fourth charge controller test main switch 182 is provided, which can be connected with the charge controller test main control module 44 in order to activate the charge controller test unit 55 in the charge controller test setting 42 of the test selection switch unit 17.

In the arrangement of FIG. 1, the components 6, 7, 8, 12 of the solar installation can be checked individually and in typical operational connections as follows with the hand testing implement 1 explained by means of FIGS. 2 to 7. After the test selection switch unit 17 is changed over from the switched-off setting 62 into the self-testing setting 22, the central module 161, controlled by means of the self-testing unit 21 over the self-testing control connection 51 and the self-testing control connection 52, checks whether the control modules 25 to 28, 31 to 33, 38 to 41, 44 to 47 are functioning properly by checking the proper closing of the test switches 146 to 160 by means of the display of voltage values on the liquid crystal display 18.

In the solar generator test setting 29 of the test selection switch unit 17, in the setting of the solar generator test switch module 30 activating the first solar generator test control module 26, the open circuit voltage of the solar generator 6 is measured. In the setting of the solar generator test switch module 30, activating the second solar generator test control module 27, the short circuit current is determined and, in the setting of the solar generator test switch module 30 activating the third solar generator test switch module 28, the actual radiation power per surface unit of solar radiation, the so-called irradiation, existing at the time of the two last-mentioned checks, is determined over the reference solar generator 14.

In the battery test setting 34 of the test selection switch unit 17, in a setting of the battery test switch module 35 activating only the first battery test control module 31, the open circuit voltage of the battery 7 is measured. In the setting of the battery switch module 35, additionally activating the second battery test control module 32, the voltage of the battery 7 is measured when the solar generator 6 is connected. In the setting of the battery test switch module 35, activating in addition to the first battery test control module 31 and the second battery control module 32 also the third battery test control module 33, the battery current is measured when the solar generator is connected. In the setting of the battery test switch module 35, activating the third solar generator test control module 28, the irradiation in the case of the last named battery test, namely the battery current when the solar generator 6 is connected, is measured over the reference solar generator 14.

In the load test setting 36 of the test selection switch unit 17 in the setting of the load test switch module 37, activating the load test main control module 38 as well as the first load test control module 39, the voltage can be detected over the load 8. In the setting of the load test switch module 37, activating the load test main control module 38 as well as the second load test control module 40, the current, flowing through the load 8, can be measured. In the setting of the load test switch module 37, activating the load test main control module 38 as well as the third load test control module 41, the associated voltage of the battery 7 can finally be checked.

In the charge controller test setting 42 of the test selection switch unit 17, in the setting of the charge controller switch module 43, activating the charge controller test main control module 44 as well as the first charge controller test control module 45, the surrounding temperature can be detected. In the setting of the charge controller test control module 43, activating the charge controller test main control module 44 as well as the second load controller test control module 46, the intrinsic consumption of the charge controller can be detected. In the setting of the charge controller test switch module 43, activating the charge controller test main control module 44 as well as the third charge controller test control module 47, all switching thresholds of the charge controller 12, namely for the deep-discharging protection and the overload protection can be checked finally by means of the protective logic module 170 over the setting of the reference voltage source 181.

It is obvious that the inventive apparatus, especially in the refinements, given by way of examples of fig. 1 to fig. 7, can also be realized integrated microelectronically and using, at least partially, application programs for carrying out the functions, without leaving the scope of the invention.

What is claimed is:

1. A device for checking at least one solar installation, said at least one solar installation having at least one photovoltaic solar generator, at least one battery, at least one charge controller, at least one load, and a connecting rail accepting a bridge and interconnecting the at least one photovoltaic solar generator, the at least one battery, the at least one charge controller and the at least one load, said connecting rail including assigned socket terminal strips and always being electrically interrupted during testing at the location for connecting to the bridge, said device comprising:

a testing means for determining characteristic parameters and conditions of the functioning capability of the solar installation, said testing means including connector strips for insertion in the assigned socket terminal strips of the connecting rail, and a means for selectively connecting the at least one photovoltaic generator, the at least one battery, the at least one charge controller and the at least one load to the testing means; and a display means for displaying said characteristic parameters and conditions.

2. The device of claim 1, wherein the testing means and display means are connected across voltage converters for supplying external energy to the at least one battery.

3. The device of one of the claims 1 or 2, further comprising the testing means including an adjustable reference voltage source.

4. The device of claim 3 wherein, in each setting of the testing means and display means for testing the solar installation, the adjustable reference voltage source is connected to the at least one charge controller and an intrinsic consumption and switching threshold of the at least one charge controller is determined.

5. The device of claim 4, further comprising the testing means including a temperature sensor for determining the surrounding temperature.

6. The device of one of the claims 1 or 2, further comprising:

control means for controlling the testing means;

switching means for connecting elements for testing; and the testing means including a self testing means for testing control means and switching means.

7. The device of one of the claims 1 or 2, further comprising the testing means including a solar generator testing means for testing an open circuit voltage and a short-circuit current of the at least one solar generator, wherein the at least one battery and the at least one load are not connected to the at least one charge controller.

8. The device of claim 7, further comprising the testing means including a reference solar generator for determining the incident irradiation from the sun.

9. The device of one of the claims 1 or 2, further comprising the testing means including a battery test means for testing the at least one battery, wherein the open circuit voltage of the at least one battery is measured with the at least one solar generator connected to the testing means and the charging current of the at least one battery is measured with the at least one load not connected to the testing means.

10. The device of one of the claims 1 or 2, further comprising the testing means including a load testing means for testing the at least one load, wherein the voltage and the current of the at least one load and the voltage of the at least one battery are measured with the at least one solar generator not connected to the testing means.

11. The device of claim 1, wherein the testing means is portable.

12. A solar power test system for testing a solar installation including:
   at least one photovoltaic solar generator;
   at least one battery;
   at least one charge controller; and
   at least one load; the solar power test system comprising:
      a connecting rail for accepting a bridge for interconnecting the at least one photovoltaic solar generator, the at least one battery, the at least one charge controller and the at least one load, said connecting rail including assigned socket terminal strips;
      a testing means for determining characteristic parameters and conditions of the functioning capability of the solar installation, said testing means including:
         connector strips for insertion in the assigned socket terminal strips of the connecting rail;
         a means for selectively connecting the at least one photovoltaic generator, the at least one battery, the at least one charge controller and the at least one load to the testing means; and
         a display means for displaying said characteristic parameters and conditions, wherein the connecting rail is always electrically interrupted during testing at the location for connecting to the bridge.

13. The system of claim 12, wherein the testing means is connected via voltage converters, for supplying external energy, to the at least one battery.

14. The system of one of the claims 12 or 13, further comprising the testing means including an adjustable reference voltage source.

15. The system of claim 14 wherein, in each setting of the testing means and display means for testing the solar installation, the adjustable reference voltage source is connected to the at least one charge controller and an intrinsic consumption and switching threshold of the at least one charge controller is determined.

16. The system of claim 15, further comprising the testing means including a temperature sensor for determining the surrounding temperature.

17. The system of one of the claims 12 or 13, wherein the testing means includes:
   control means for controlling the switching means;
   switching means for connecting elements for testing; and
   a self testing means for testing the switching means.

18. The system of one of the claims 12 or 13, further comprising the testing means including a solar generator testing means for testing an open circuit voltage and a short-circuit current of the at least one solar generator, wherein the at least one battery and the at least one load are not connected to the at least one charge controller.

19. The system of claim 18, further comprising the testing means including a reference solar generator for determining the incident irradiation from the sun.

20. The system of one of the claims 12 or 13, further comprising the testing means including a battery test means for testing the at least one battery, wherein the open circuit voltage of the at least one battery is measured with the at least one solar generator connected to the testing means and the charging current of the at least one battery is measured with the at least one load not connected to the testing means.

21. The system of one of the claims 12 or 13, further comprising the testing means including a load testing means for testing the at least one load, wherein the voltage and the current of the at least one load and the voltage of the at least one battery are measured with the at least one solar generator not connected to the testing means.

22. The system of claim 12, wherein the testing means is portable.

23. A test system for checking components of a solar installation comprising:
   means for determining characteristic parameters and conditions of the functioning capability of the solar installation;
   a connecting rail having a disconnectable bridge for interconnecting components of the solar installation and socket terminal providing connection to the components;
   said means for determining including connector strips for insertion in the socket terminal strips of the connecting rail; and
   a display means for displaying said characteristic parameters and conditions.

* * * * *